United States Patent
Lin et al.

(10) Patent No.: US 7,562,696 B2
(45) Date of Patent: Jul. 21, 2009

(54) JUXTAPOSING STRUCTURE FOR HEATED ENDS OF HEAT PIPES

(75) Inventors: Kuo-Len Lin, Wugu Township, Taipei County (TW); Wen-Jung Liu, Wugu Township, Taipei County (TW)

(73) Assignee: Cpumate, Inc., Taipei (TW)

( * ) Notice: Subject to any disclaimer, the term of this patent is extended or adjusted under 35 U.S.C. 154(b) by 624 days.

(21) Appl. No.: 11/383,724

(22) Filed: May 16, 2006

(65) Prior Publication Data

US 2007/0267181 A1    Nov. 22, 2007

(51) Int. Cl.
*H05K 7/20* (2006.01)
(52) U.S. Cl. .............................. 165/104.33; 165/104.21
(58) Field of Classification Search ................ 165/80.3, 165/104.33; 361/700
See application file for complete search history.

(56) References Cited

U.S. PATENT DOCUMENTS

| | | | |
|---|---|---|---|
| 6,741,468 B2* | 5/2004 | Jing et al. | 361/700 |
| 7,327,574 B2* | 2/2008 | Frank et al. | 361/711 |
| 7,455,102 B2* | 11/2008 | Cheng | 165/104.33 |
| 2003/0102108 A1* | 6/2003 | Sarraf et al. | 165/80.3 |
| 2004/0027805 A1* | 2/2004 | Lai | 361/700 |
| 2004/0112570 A1* | 6/2004 | Wenger et al. | 165/80.3 |
| 2004/0201958 A1* | 10/2004 | Lev | 361/687 |
| 2006/0082972 A1* | 4/2006 | Kim | 361/709 |
| 2007/0029071 A1* | 2/2007 | Hwang et al. | 165/104.33 |
| 2007/0095510 A1* | 5/2007 | Lin et al. | 165/104.33 |

FOREIGN PATENT DOCUMENTS

TW    522004    10/2004

* cited by examiner

*Primary Examiner*—Allen J Flanigan

(57) ABSTRACT

A juxtaposing structure for the heated ends of a plurality of heat pipes includes a plurality of heat pipes and a locking unit. Each heat pipe has a heated end. The surface of the heated end of each heat pipe has an upper plane and a lower plane facing to each other and sidewall faces formed between both sides of the two planes. Sidewall faces of any two adjacent heat pipes adjoin and abut against each other. The locking unit locks the heated end of each heat pipe to form into one body. With the combination of each lower plane, a heated surface having a larger area can be formed.

6 Claims, 6 Drawing Sheets

JUXTAPOSING STRUCTURE FOR HEATED ENDS OF HEAT PIPES

BACKGROUND OF THE INVENTION

1. Field of the Invention

The present invention relates to a juxtaposing structure for the heated ends of a plurality of heat pipes, and in particular to a portion of the heat pipe for thermally connecting to a heat-generating electronic element (i.e., the heated end). A heated surface having a larger area can be formed by means of juxtaposing a plurality of heat pipes.

2. Description of Prior Art

Generally, a heat pipe can be applied to the heat-dissipating device of electronic products. One end of the heat pipe is thermally connected to the heat-generating electronic element, and the other end thereof penetrates through a plurality of heat-dissipating fins. With the excellent heat conductivity of the heat pipe, the heat generated by the heat-generating electronic element can be transmitted to each heat-dissipating fin via the heat pipe to gradually dissipate the heat and lower the temperature. Further, the heat accumulated among each heat-dissipating fin can be rapidly dissipated via a heat-dissipating fan, thereby to achieve an excellent heat-dissipating effect.

The cross section of the heat pipe is formed into a circular pipe and the surface area is not large enough after being pressed flat. Therefore, in conventional art, the heat pipe is connected to a heat-conducting plate and then the heat-conducting plate adheres to the surface of the heat-generating electronic element. However, such method causes the heat pipe unable to directly contact with the heat-generating electronic element and thus it is difficult to exhibit the optimal performance. Further, the heat-conducting plate is usually made of copper, which is heavy and expensive. If the aluminum is used, the heat-conducting performance will be affected due to the bad heat conductivity of aluminum. Therefore, a method is proposed, in which the heat pipe is pressed to form the heated end of the heat pipe into a flat surface so as to facilitate the adhesion to the upper surface of the heat-generating electronic element, as disclosed in Taiwan Patent Publication No.M248231 entitled "Heat-Dissipating Device For Heat Pipe".

However, in the above-mentioned method, if the surface area after pressing is not large enough, the heated end of the heat pipe may be unable to completely cover the upper surface of the heat-generating electronic element. On the other hand, if a larger area is to be pressed out, the heat pipe may be broken during the pressing operation because of the insufficient thickness of the pipe.

In view of the above, the inventor proposes the present invention to overcome the above problems based on his expert experiences and deliberate researches.

SUMMARY OF THE INVENTION

The present invention is to provide a juxtaposing structure for the heated ends of a plurality of heat pipes, in which the heated end of the heat pipe can directly contact with the heat-generating electronic element and the heated end has a larger area for completely covering and adhering to the upper surface of the heat-generating electronic element.

The present invention provides a juxtaposing structure for the heated ends of a plurality of heat pipes, which comprises a plurality of heat pipes and a locking unit. Each heat pipe has a heated end. The surface of the heated end of each heat pipe has an upper plane and a lower plane facing to each other and sidewall faces formed between both sides of the two planes. Sidewall faces of any two adjacent heat pipes adjoin and abut against each other. The locking unit locks the heated end of each heat pipe to form into one body. With the combination of each lower plane, a heated surface having a larger area can be formed.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

In order to make the Examiner better understand the characteristics and the technical contents of the present invention, a detailed description relating to the present invention will be made with reference to the accompanying drawings. However, it should be understood that the drawings are illustrative but not used to limit the scope of the present invention.

Figure 1:
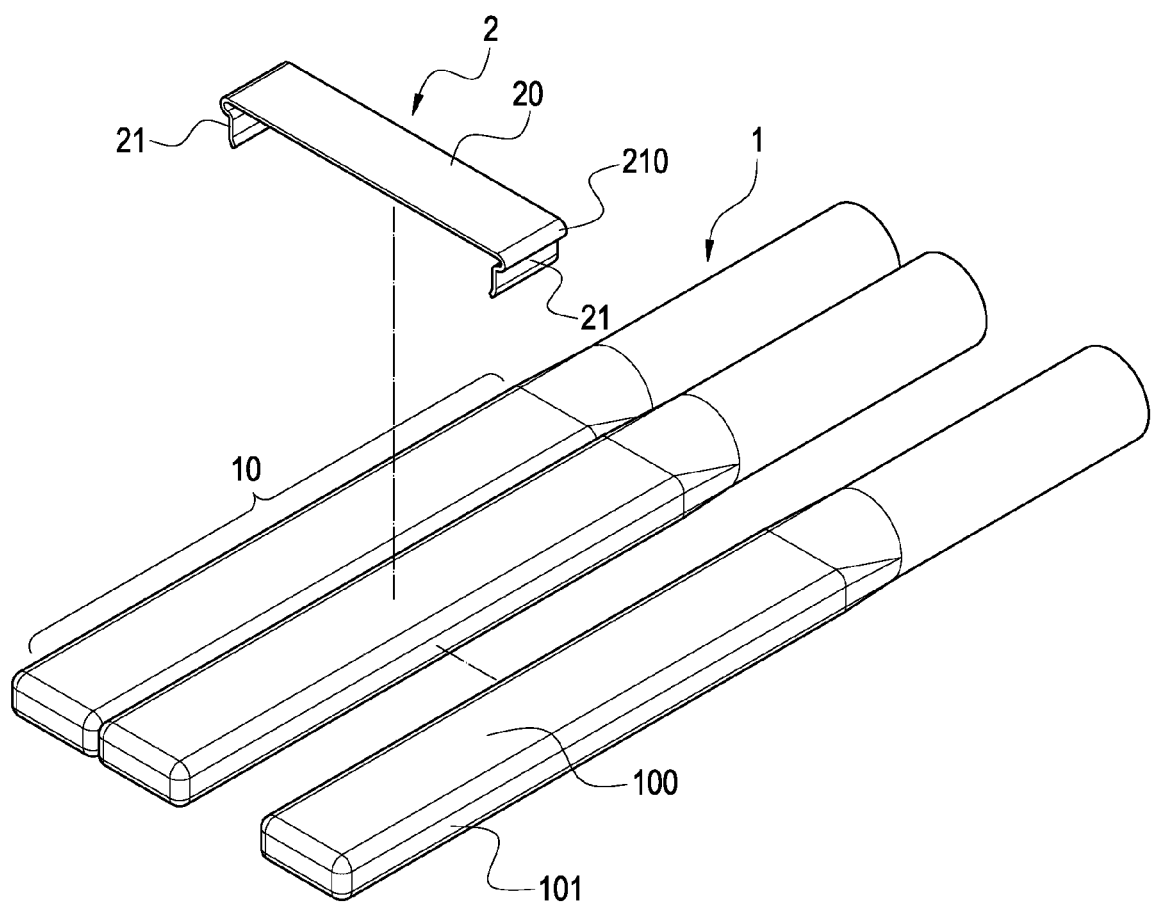
FIG. 1 is a partially exploded perspective n view of the present invention.
Figure 2:
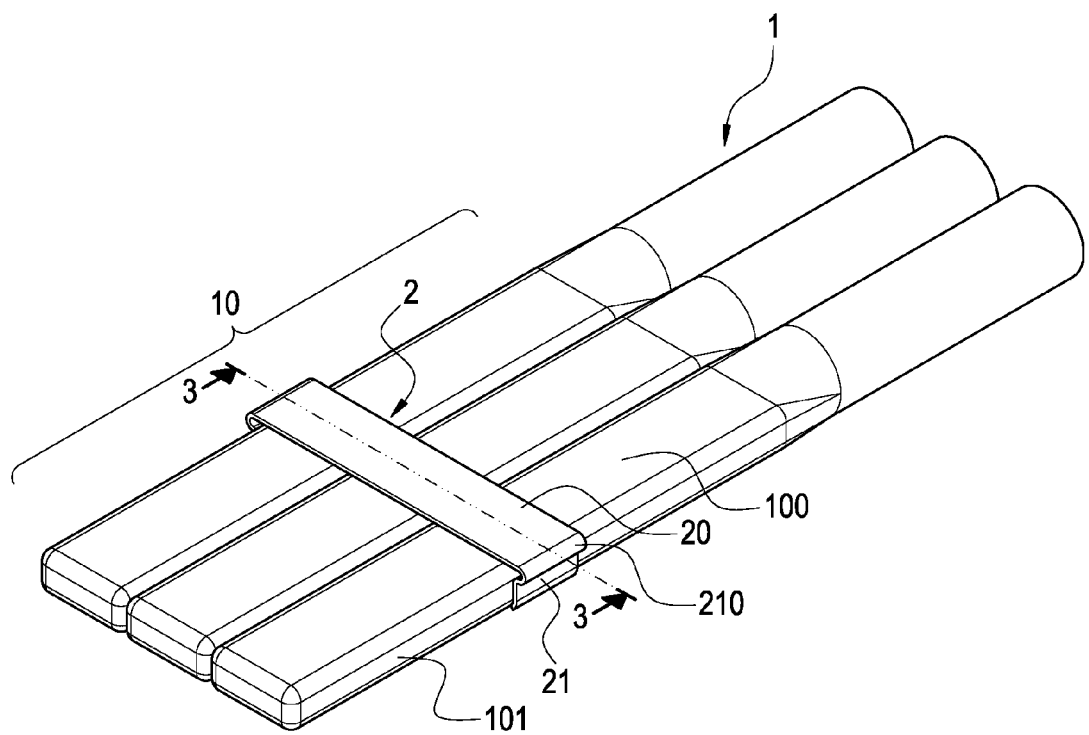
FIG. 2 is a partially assembled perspective n view of the present invention.
Figure 3:
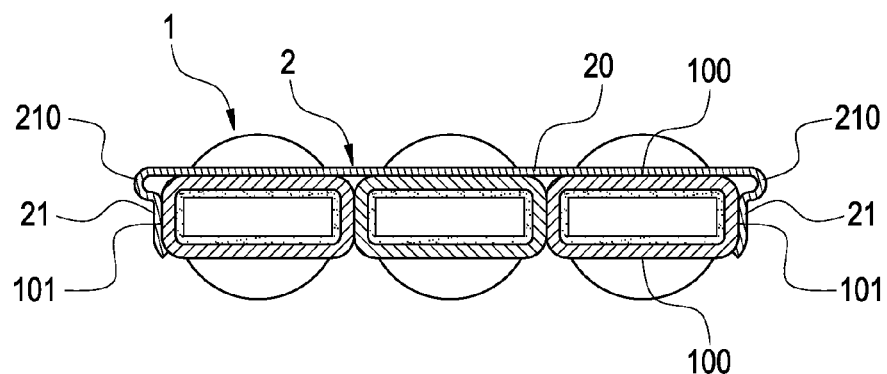
FIG. 3 is a cross-sectional perspective view of the line 3-3 in FIG. 2.
Figure 4:
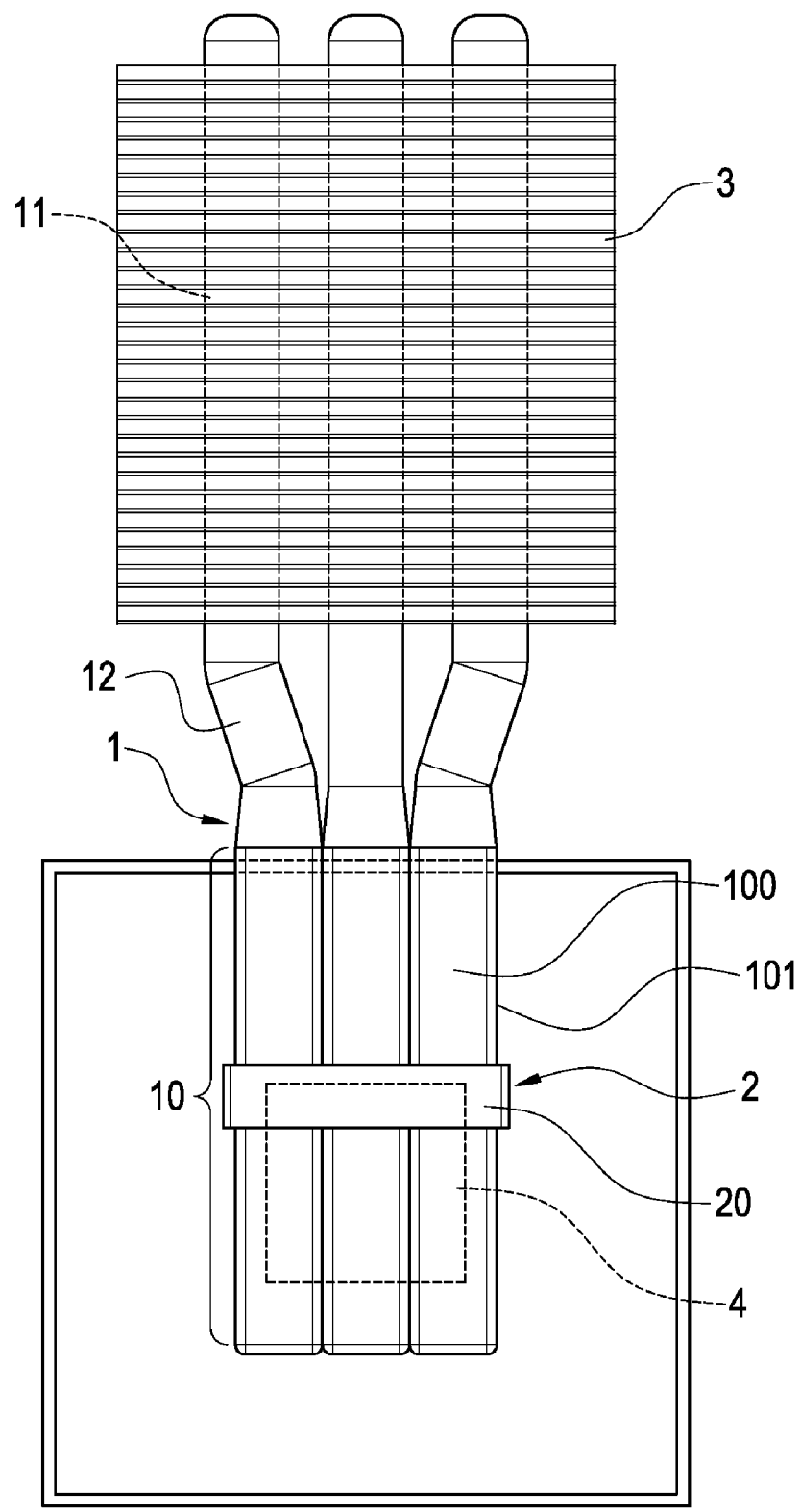
FIG. 4 is a schematic plan view of the first embodiment of the present invention.

FIG. 1 is a partially exploded perspective n view of the present invention. FIG. 2 is a partially assembled perspective n view of the present invention. FIG. 3 is a cross-sectional perspective view of the line 3-3 in FIG. 2. The present invention provides a juxtaposing structure for the heated ends of a plurality of heat pipes. After the heated ends 10 of a plurality of heat pipes 1 are juxtaposed, the heated end 10 of each heat pipe 1 together forms a heated surface having a larger area, so that the heated surface can adhere to the heat-generating electronic element 4 such as a central processing unit (CPU), as shown in FIG. 4. The heated area of the heated surface formed by the heated end 10 of each heat pipe 1 is substantially identical to the area of the upper surface of the heat-generating electronic element 4 to be adhered, thereby to completely cover and adhere thereto.

Figure 5:
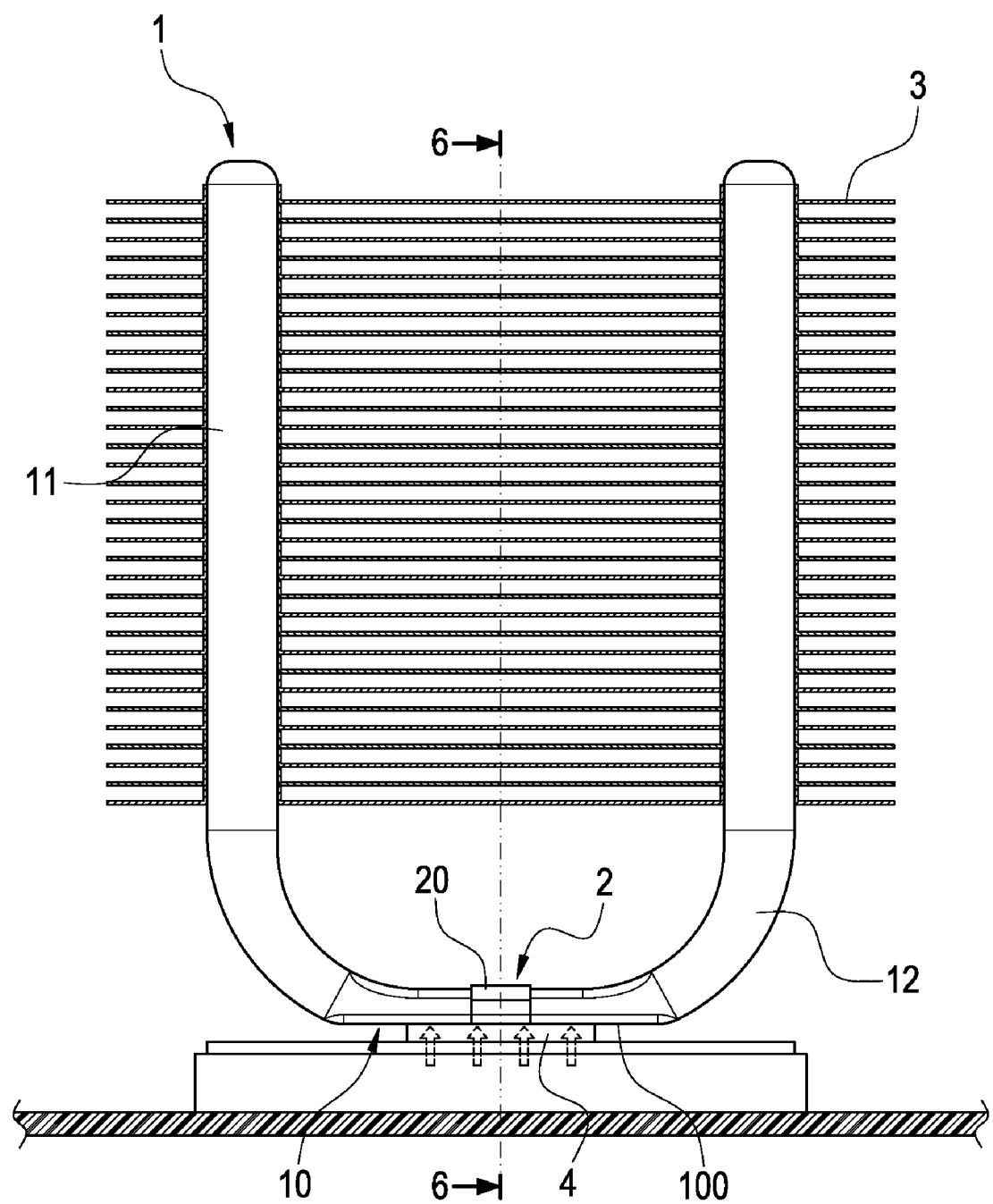
FIG. 5 is a schematic plan view of the second embodiment of the present invention.
Figure 7:
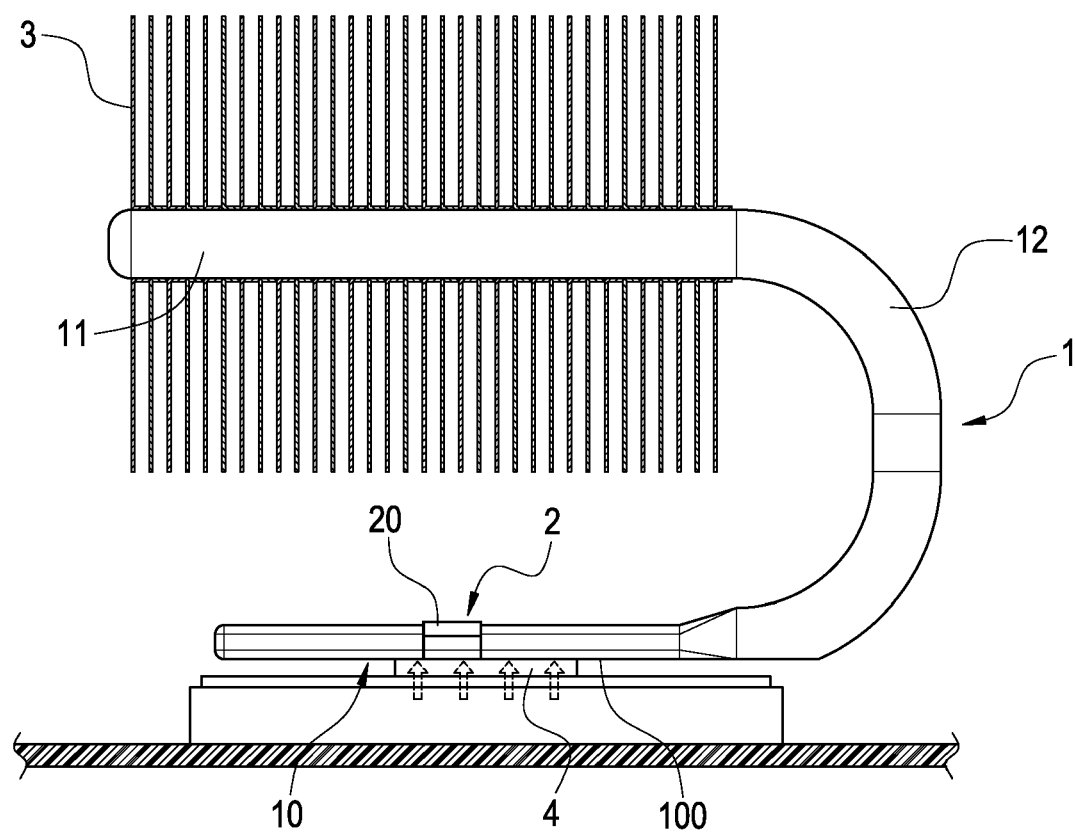
FIG. 7 is a schematic plan view of the third embodiment of the present invention.

According to the above, each heat pipe 1 can be formed into a straight pipe, a slightly curved pipe in the middle part (as shown in FIG. 4), an upright U-lettered shape (as shown in FIG. 5) or a side-lay U-lettered shape (as shown in FIG. 7). Further, each heat pipe has a heated end 10 and at least one condensed end 11. The heated end 10 is not necessarily to be either end of the heat pipe but can be the middle part of the heat pipe 1. A heat-conducting section 12 is connected between the heated end 10 and the condensed end 11 of each heat pipe 1, thereby to constitute the heat pipe 1.

With reference to FIGS. 1 to 3, in the present invention, the cross section of the heated end 10 of each heat pipe 1 is formed into a square, so that the surface of the heated end 10 of each heat pipe 1 has an upper and a lower planes 100 facing to each other and sidewall faces 101 between both sides of the two planes 100. The heated ends 10 of those heat pipes 1 are juxtaposed and the sidewall faces 101 of any two adjacent heat pipes 1 adjoin and abut against each other. With the combination of each lower plane 100, a heated surface having a larger area can be formed for thermally contacting with and adhering to the heat-generating electronic element 4.

After the heated end 10 of each heat pipe 1 has been juxtaposed, a locking unit 2 is used to lock the heated ends 10 of those heat pipes 1 to form in one body. The locking unit 2 can be a locking tool having a locking tool body 20 extending in the arranging direction of the heat pipes 1 and locking arms extending downwardly from both sides of the locking tool body 20. The locking tool body 20 abuts against the upper plane 100 of the heated end 10 of each heat pipe 1. Two locking arms 21 abut against the sidewall faces 101 on both sides of the outmost two heat pipes 1, respectively. Between the two locking arms 21 and the locking tool body 20, elastic portions 210 are formed with bending parts, so that the two locking arms 21 has elastic force to lock the heat pipes 1.

As show in FIG. 4, it is a schematic plan view of the first embodiment of the present invention. In this embodiment, each heat pipe 1 is formed into a straight pipe or the heat-conducting section 12 is slightly curved. The condensed end 11 of each heat pipe 1 commonly penetrates through a plurality of heat-dissipating fins 3. According to the figure, it is apparent that each heat pipe 1 is juxtaposed and bound together by the locking unit 2, and further each heat pipe 1 can directly adhere to the upper surface of the heat-generating electronic element 4. With this arrangement, each heat pipe 1 can directly conduct and dissipate the heat generated by the heat-generating electronic element 4.

Figure 6:
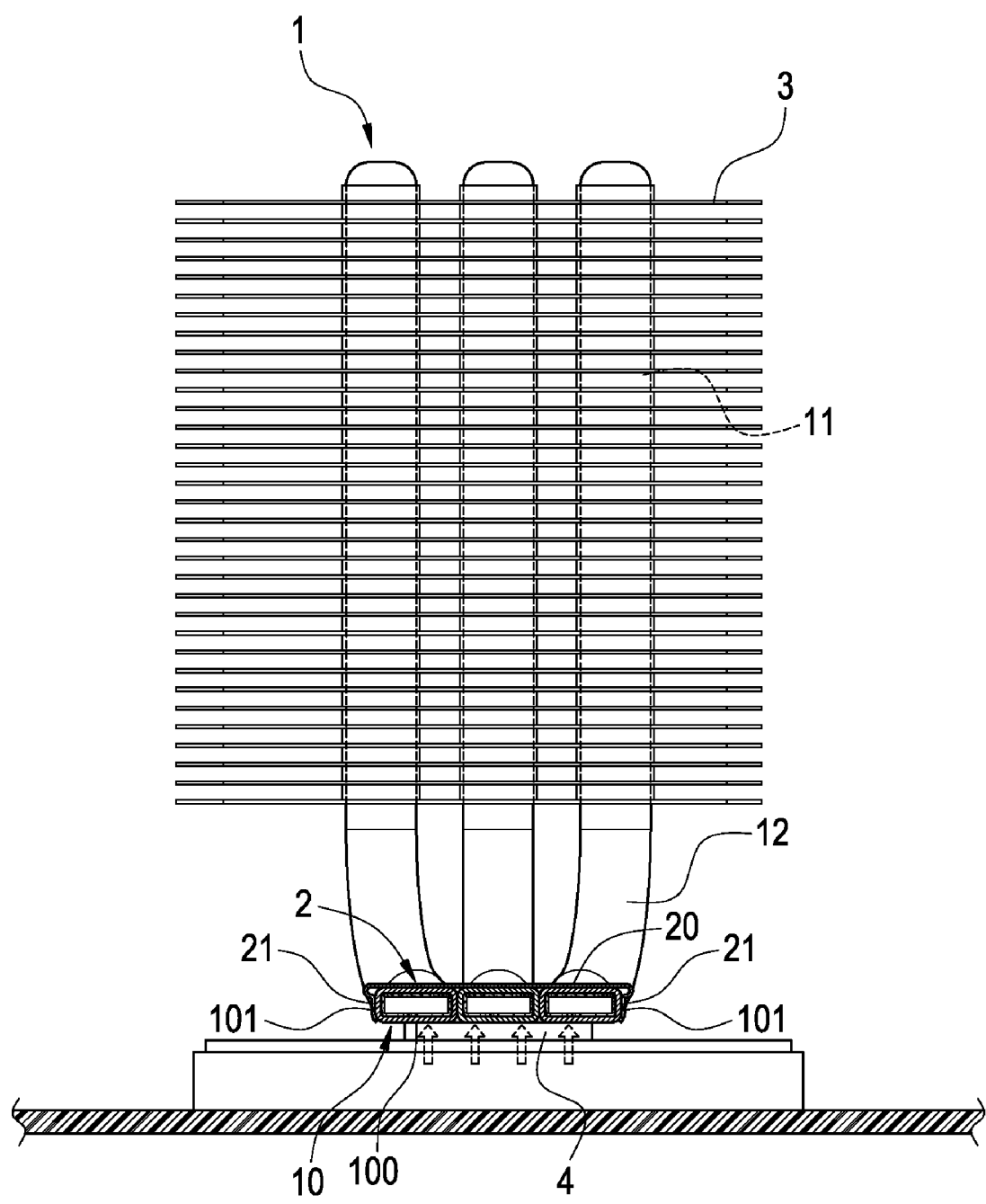
FIG. 6 is a cross-sectional perspective view of the line 6-6 in FIG. 5.

FIG. 5 is a schematic plan view of the second embodiment of the present invention, and FIG. 6 is a cross-sectional perspective view of the line 6-6 in FIG. 5. In this embodiment, each heat pipe 1 is formed into an upright U-lettered shape. The heated end 10 of each heat pipe 1 is located at the bottom of the U-lettered shape, and both ends of the U-lettered shape extending upwardly are used as the condensed ends 11. Both condensed ends 11 also penetrate through a plurality of heat-dissipating fins 3. According to the present embodiment, the heated end 10 of the heat pipe 1 is not necessary to be either end portion of the pipe. Depending on the curved construction and different applications of the heat pipe 1, the heated end 10 can be also located in the middle part of the pipe. The present embodiment can also achieve the same object as that in the first embodiment.

As show in FIG. 7, it is a schematic plan view of the third embodiment of the present invention. In this embodiment, each heat pipe 1 is formed into a side-lay U-lettered shape. The heated end 10 of each heat pipe 1 is located at one extending end of the U-lettered shape, and the condensed end 11 is located at the other extending end of the U-lettered shape. Similarly, the condensed end 11 penetrates through a plurality of heat-dissipating fins 3.

Therefore, with the above construction, the juxtaposing structure for the heated ends of a plurality of heat pipes in accordance with the present invention can be obtained.

According to the above, the present invention indeed achieves the desired effects and overcomes the drawbacks of prior art by employing the above structures. Therefore, the present invention involves the novelty and inventive steps, and conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A juxtaposing structure for heated ends of heat pipes, comprising a plurality of heat pipes, each heat pipe having a heated end, a surface of the heated end of each heat pipe having an upper and a lower planes facing to each other and sidewall faces formed between both sides of the two planes; and a locking unit,
   wherein the sidewall faces of any two adjacent heat pipes adjoin and abut against each other, the locking unit locks the heated ends of the heat pipes to form into one body, thereby to form a heated surface having a larger area with the combination of each lower plane,
   wherein the locking unit is a locking tool,
   wherein the locking tool has a locking tool body extending in an arranging direction of the heat pipes and locking arms extending downwardly from both sides of the locking tool body, the locking tool body abuts against the upper plane of the heated end of each heat pipe, and the two locking arms abut against the sidewall faces on both sides of the outmost two heat pipes, respectively,
   elastic portions having bending parts are formed between the locking tool body and the two locking arms, and
   wherein the elastic portions respectively extending beyond corresponding locking arms along a longitudinal extension direction of the locking tool body.

2. The juxtaposing structure according to claim 1, wherein each heat pipe is formed into a straight pipe.

3. The juxtaposing structure according to claim 1, wherein each heat pipe is formed into an upright U-lettered shape, and the heated end of each heat pipe is located at the bottom of the U-lettered shape.

4. The juxtaposing structure according to claim 1, wherein each heat pipe is formed into a side-lay U-lettered shape, and the heated end of each heat pipe is located at an extending end of the U-lettered shape.

5. The juxtaposing structure according to claim 1, wherein the elastic portion is C-shaped.

6. The juxtaposing structure according to claim 1, wherein the elastic portions outwardly and downwardly extend from opposite ends of the locking tool body, and then inwardly and downwardly extend toward an inner side of the locking tool body, the locking arms straightly and downwardly extending from the elastic portions and perpendicular to the locking tool body.

* * * * *